(12) United States Patent
Blumhagen et al.

(10) Patent No.: US 9,244,144 B2
(45) Date of Patent: *Jan. 26, 2016

(54) METHOD FOR DETERMINING MAGNETIC RESONANCE DATA AND A MAGNETIC RESONANCE SYSTEM

(71) Applicant: Siemens Aktiengesellschaft, Munich (DE)

(72) Inventors: Jan Ole Blumhagen, Erlangen (DE); Matthias Fenchel, Erlangen (DE); Ralf Ladebeck, Erlangen (DE); Harald H. Quick, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 745 days.

This patent is subject to a terminal disclaimer.

(21) Appl. No.: 13/628,938

(22) Filed: Sep. 27, 2012

(65) Prior Publication Data
US 2013/0082702 A1 Apr. 4, 2013

(30) Foreign Application Priority Data

Sep. 30, 2011 (DE) .......................... 10 2011 083 898

(51) Int. Cl.
*G01R 33/565* (2006.01)
*G01R 33/34* (2006.01)
(Continued)

(52) U.S. Cl.
CPC ........ *G01R 33/56563* (2013.01); *G01R 33/481* (2013.01); *G01R 33/4835* (2013.01); *G01R 33/56383* (2013.01)

(58) Field of Classification Search
CPC ...................... G01R 33/56383; G01R 33/4835; G01R 33/481; G01R 33/56563; G01R 33/56572; G01R 33/445

USPC .................................................. 324/307–309
See application file for complete search history.

(56) References Cited

U.S. PATENT DOCUMENTS

2003/0011369 A1* 1/2003 Brittain et al. ................ 324/309
2003/0206012 A1* 11/2003 Hinks et al. ................... 324/307
(Continued)

FOREIGN PATENT DOCUMENTS

DE 102009004896 A1 7/2010
DE 102010006431 A1 8/2011
DE 102010044520 A1 3/2012

OTHER PUBLICATIONS

J. O. Blumhagen et al., "MR-based Field-of-View Extension: Compensation of Field Imperfections", In Proc. Intl. Soc. Mag. Reson. Med. 19, 2011, p. 2693; Others; 2011.

(Continued)

*Primary Examiner* — Melissa Koval
*Assistant Examiner* — Rishi Patel
(74) *Attorney, Agent, or Firm* — Harness, Dickey & Pierce, P.L.C.

(57) ABSTRACT

A method is disclosed for acquiring magnetic resonance (MR) data for a plurality of layers of an object to be examined in a section of a magnetic resonance system having a basic magnetic field, wherein the section is located at the edge of a Field of View of the magnetic resonance system in the first direction. The method includes producing a first gradient field having a non-linearity of its location dependence in such a way that in the section the non-linearity compensates a local inhomogeneity of the basic magnetic field, and then multiple positioning of the object to be examined in a first direction, so the plurality of layers of the object to be examined perpendicular to the first direction successively includes the section. Finally, it includes the acquisition of magnetic resonance data for each of the layers with recording sequences.

21 Claims, 8 Drawing Sheets

(51) Int. Cl.
G01R 33/48 (2006.01)
G01R 33/483 (2006.01)
G01R 33/563 (2006.01)

(56) References Cited

U.S. PATENT DOCUMENTS

| | | | |
|---|---|---|---|
| 2004/0140804 A1* | 7/2004 | Polzin et al. | 324/309 |
| 2010/0102811 A1* | 4/2010 | Demas et al. | 324/309 |
| 2010/0182007 A1 | 7/2010 | Dornhaus et al. | |
| 2010/0244823 A1 | 9/2010 | Abe | |
| 2011/0187364 A1 | 8/2011 | Blumhagen et al. | |
| 2012/0056621 A1 | 3/2012 | Blumhagen et al. | |
| 2012/0235680 A1 | 9/2012 | Blumhagen et al. | |
| 2013/0057282 A1* | 3/2013 | Blumhagen et al. | 324/309 |
| 2013/0197349 A1* | 8/2013 | Blumhagen et al. | 600/411 |
| 2013/0237806 A1* | 9/2013 | Blumhagen et al. | 600/411 |
| 2014/0009153 A1* | 1/2014 | Blumhagen et al. | 324/309 |
| 2014/0035577 A1* | 2/2014 | Blumhagen et al. | 324/309 |
| 2014/0306704 A1* | 10/2014 | Blumhagen et al. | 324/309 |

OTHER PUBLICATIONS

Zenge MO et al.: "High-Resolution Continuously Acquired Peripheral MR Angiography Featuring Partial Parallel Imaging GRAPPA", Magnetic Resonance in Medicine 56, 2006, pp. 859-865; Others; 2006.

H.-P. Fautz et al: "Sliding Multislice (SMS): A New Technique for Minimum FOV Usage in Axial Continuously Moving-Table Acquisitions", Magnetic Resonance in Medicine 55:363-370 (2006); Others; 2006.

Zenge MO, et.al.: "Novel reconstruction method for three-dimensional axial continuously moving table whole-body magnetic resonance imaging featuring autocalibrated parallel imaging GRAPPA", Magn. Reson Med, Apr. 2009, 61(4), pp. 867-873; Others; 2009.

* cited by examiner

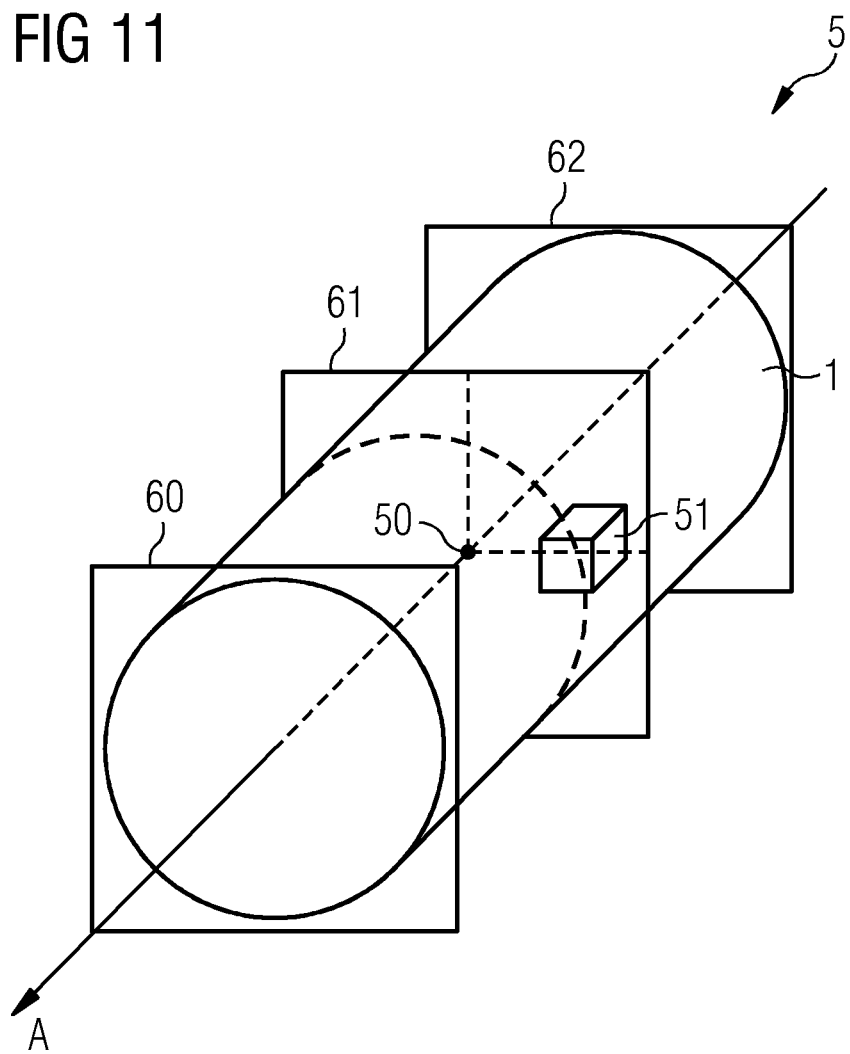

METHOD FOR DETERMINING MAGNETIC RESONANCE DATA AND A MAGNETIC RESONANCE SYSTEM

PRIORITY STATEMENT

The present application hereby claims priority under 35 U.S.C. §119 to German patent application number DE 10 2011 083 898.8 filed Sep. 30, 2011, the entire contents of which are hereby incorporated herein by reference.

FIELD

At least one embodiment of the present invention generally relates to Magnetic resonance tomography (MRT).

BACKGROUND

Magnetic resonance tomography (MRT) is an imaging method which enables the recording of two-dimensional (2D) or three-dimensional (3D) image data sets which can image structures inside a person being examined, in particular also soft tissue, with high resolution. In the case of MRT the magnetic moments of protons in an object to be examined are oriented in a basic magnetic field. The nuclear spins can be deflected or excited from the oriented position, i.e. the rest position, or a different state by radiating high frequency pulses. The evolution over time of the excited magnetization is then detected by way of one or more high frequency (HF) coil(s).

By applying a layer selection gradient when radiating the high frequency pulses only nuclear spins in which the resonance condition is fulfilled owing to the local magnetic field strength are excited in a layer of the object to be examined. Further spatial encoding can occur by applying at least one phase encoding gradient and a frequency encoding gradient during reading-out or a signal detection period. It is consequently possible to obtain MR images of a plurality of layers of a person being examined. By means of suitable display methods it is thus possible to provide for diagnosis a 3-dimensional (3D) image of a certain region of the person being examined in the form of a 3D MR image.

However, the measureable volume is typically limited in a magnetic resonance (MR) system owing to physical and technical conditions, such as a limited homogeneity of the basic magnetic field and a non-linearity of the gradient field. A measuring range, what is known as a "Field of View" (FoV), is therefore limited to a volume in which the physical features mentioned above lie within a predefined tolerance range and therefore imaging, which is true to the original, of the object to be examined is possible with conventional measuring sequences. The Field of View limited in this way is, in particular in the x and y directions, i.e. perpendicular to a longitudinal axis of a ring tunnel of the magnetic resonance system, considerably smaller than the volume limited by the rung tunnel of the magnetic resonance system. In conventional magnetic resonance systems a diameter of the rung tunnel is by way of example about 60 cm, whereas the diameter of the conventionally used Field of View, in which the physical features mentioned above lie within the tolerance range, is for example 50 cm.

Significant differences in the homogeneity of the basic magnetic field can occur outside of the Field of View. An MR image which has been taken exhibits distortions in the corresponding region. There are various applications in which a high level of faithfulness to location, i.e. low distortion of the MR image data, is necessary.

In the case of hybrid systems for instance, such as a hybrid system comprising a magnetic resonance tomograph and a positron emission tomograph, what is known as an MR/PET hybrid system, it is very important to determine structures of the object to be examined as accurately as possible, even in the edge region. With an MR/PET hybrid system the human attenuation correction by way of example is of crucial importance. With the human attenuation correction the intensity attenuation of the photons emitted after an interaction of positrons and electrons is determined on their path through absorbent tissue to the detector and the received signal of the PET corrected by precisely this attenuation. MR data is acquired for this purpose which images the complete anatomy of the object to be examined in the direction of the high-energy photons emitted by the positron emission tomography. The anatomy of the object to be examined should therefore be detected as accurately as possible even in the edge region of the tunnel of the hybrid system. Structures which are located in these regions are, in the case of patients to be examined, by way of example the arms, which can be arranged in the edge region close to the tunnel inside wall of the hybrid system.

Further applications in which a high level of faithfulness to location is required are MR-based interventions, MR-based radiation planning for radiation therapy systems, whole body MR applications, such as in MR oncology and MR angiography in particular when used on short magnets which have a particularly limited FoV, and post-processing applications such as "composing" or "fusion" with imaging methods with a high level of faithfulness to location, such as computed tomography or PET.

To expand the Field of View methods are known in the literature for example which enable the non-linearity of a gradient field used for spatial encoding during the recording of MR data to be used to compensate an inhomogeneity of the basic magnetic field. To record 3D MR images it is necessary to record MR data from a plurality of layers. However, since the inhomogeneity of the basic magnetic field is location-dependent, compensation at a plurality of sites is complicated or possible only with difficulty using the known methods. Gaps can result for example between the individual layers, via which no MR information may be obtained and which therefore have to be interpolated. This limits the possibility of producing expanded Field of View 3D MR images.

SUMMARY

The inventors have recognized that there is a need to provide an improved method for recording MR data of a plurality of layers of an object to be examined in a section at the edge of the Field of View of an MR system.

According to one aspect of at least one embodiment of a method for acquiring magnetic resonance (MR) data for a plurality of layers of an object to be examined in a section of a magnetic resonance system is provided with a basic magnetic field. Here the section is located at the edge of a Field of View of the magnetic resonance system in the first direction. The method includes producing a first gradient field having a non-linearity of its location dependence in such a way that in the section the non-linearity compensates a local inhomogeneity of the basic magnetic field. The method also includes the multiple positioning of the object to be examined in a first direction, so the plurality of layers of the object to be examined perpendicular to the first direction successively includes the section. The method also includes acquiring magnetic resonance data for each of the layers with recording sequences.

According to a further embodiment, a magnetic resonance system for acquiring MR data for a plurality of layers of an object to be examined in a section of the magnetic resonance system is provided with a basic magnetic field, wherein the section is located at the edge of a Field of View of the magnetic resonance system in the first direction. The magnetic resonance system comprises a gradient system which is configured to produce a first gradient field with a non-linearity of its location dependence in such a way that in the section the non-linearity compensates a local inhomogeneity of the basic magnetic field. The MR system also comprises a couch, which can be moved in a first direction, having an object to be examined arranged thereon, which is configured to position the object to be examined in the first direction several times, so the plurality of layers of the object to be examined perpendicular to the first direction successively comprises the section, and a receiving system which is configured to acquire magnetic resonance data for each of the layers with recording sequences.

BRIEF DESCRIPTION OF THE DRAWINGS

FIG. 11 illustrates the positioning of layers in relation to the section.

DETAILED DESCRIPTION OF THE EXAMPLE EMBODIMENTS

Figure 1:
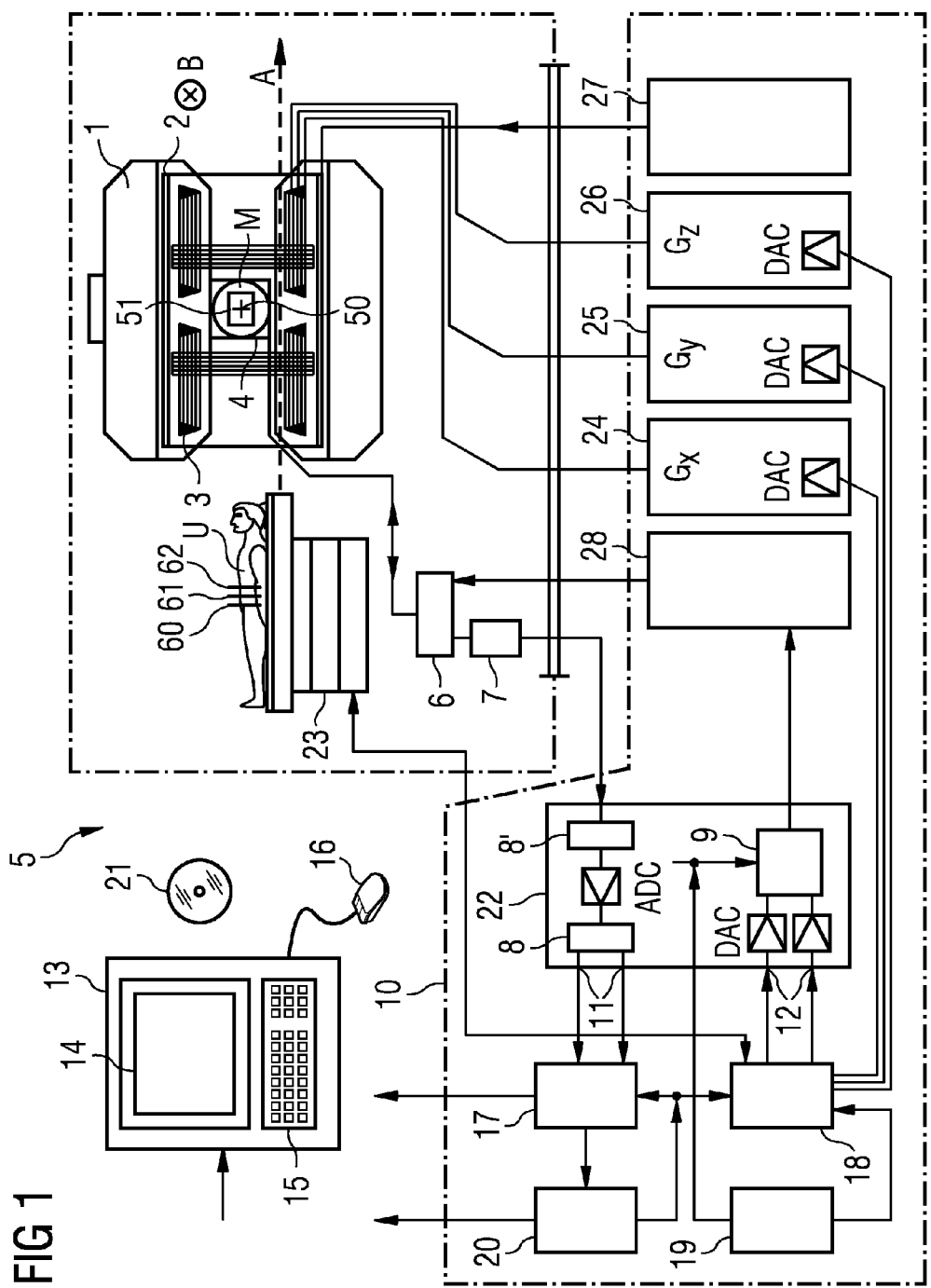
FIG. 1 schematically shows a magnetic resonance system according to an embodiment of the present invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

According to one aspect of at least one embodiment of a method for acquiring magnetic resonance (MR) data for a plurality of layers of an object to be examined in a section of a magnetic resonance system is provided with a basic magnetic field. Here the section is located at the edge of a Field of View of the magnetic resonance system in the first direction. The method includes producing a first gradient field having a non-linearity of its location dependence in such a way that in the section the non-linearity compensates a local inhomogeneity of the basic magnetic field. The method also includes the multiple positioning of the object to be examined in a first direction, so the plurality of layers of the object to be examined perpendicular to the first direction successively includes the section. The method also includes acquiring magnetic resonance data for each of the layers with recording sequences.

It is possible for the magnetic field to be arranged in the first direction. This is typically the case for superconducting coil magnets in which the magnetic field is oriented in the coil axis. The object to be examined is then located inside a tube inside the magnet. Positioning of the object to be examined, for example by the method of a table or a couch, is also possible in the direction parallel to the coil axis. It is possible for example for the section to comprise an extension in the first direction, so a plurality of layers simultaneously includes the section.

However, it is also possible to use other constructions of magnet. In addition to the conventional tunnel-shaped magnet constructions with horizontally extending basic magnet field direction, magnet constructions exist in which the magnetic poles of a superconducting magnet, electromagnet, or permanent magnet oppose each other so as to be parallel. The direction of the basic magnetic field usually extends in the vertical direction. Inhomogeneities occur in the edge region of the basic magnetic field even with a basic magnetic field configuration of this kind. The positioning of the object to be examined then has to be adjusted differently accordingly to the position of the section.

The part of a measuring sequence for producing an overall MR image can be called a recording sequence which is necessary for recording MR data of a certain layer. Here layer can mean for example a layer which is located transversally to the direction of positioning, i.e. the first direction.

Compensation of the inhomogeneities of the basic magnetic field by non-linearities of a first gradient field denotes a state in which the inhomogeneities are nullified or removed in such a way by the non-linearities that in an MR image based thereon there are no more distortions or the distortions are below a certain threshold value. In this context distortion means a signal value of a pixel at a predefined location (x, y, z) of the object to be examined, by way of example at a predetermined location in the above-described edge region, appears at a different location (x1, y1, z1) in the image of the object to be examined determined from the acquired magnetic resonance data, i.e. the MR image. The coordinates (x, y, z) are also called the actual position and the coordinates (x1, y1, z1) are also called the distorted position. Distortions can occur in the edge region of the Field of View in particular, and these cannot be compensated by subsequent rectifying of the image of the object to be examined since a plurality of adjacent actual positions by way of example can be imaged onto one or more distorted position(s) located close to each other. Since, by producing a suitable gradient field, the non-linearity of the gradient field and the basic magnetic field inhomogeneity cancel each other out at the predetermined location or region, no or only slight distortions occur for this region, so a usable image of the object to be examined can be determined in this region. In this connection the Field of View of the magnetic resonance system then denotes for example the region in which distortions of an MR image based on MR data are slight.

Compensation of the inhomogeneities of the basic magnetic field can be made for a section which extends away from the edge of the Field of View of the magnetic resonance system in only one direction. If the magnetic resonance system is a magnetic resonance system with a horizontally extending tube, defining the first direction, inside a superconducting magnet, then the section can be located in the horizontal plane for example on one side in relation to the coil axis, or central axis of the tube (parallel to the first direction). However, it is also possible to carry out compensation for a section which includes two disjunct volumes which extend in the horizontal plane on either side of the central axis of the tube outwardly away from the edge of the Field of View. An attenuation correction can then be made for both sides for PET images. A recording sequence of this kind, which allows compensation in a section which adjoins the Field of View of the MR system at two different positions of typically comprises two 180° inversion pulses and the recording of two spin echoes (dual spin echo).

Compensation according to the aspect currently being discussed in particular allows a 3D MR image to be produced which has a correction of distortions throughout the entire region of the MR image which, during recording of the MR data, lay inside the section in each case. It is possible for example for the section to have an extent of only a few centimeters, for instance 5 cm, in the first direction. The cause of this may be that the local inhomogeneities of the basic magnetic field exhibit a variation in the first direction. A correction by way of non-linearities of a first gradient field is then only ever possible for a certain region in the first direction. If, however, in accordance with the aspect currently being discussed, a 3D MR image is produced which has a depth in the first direction which is greater than the corresponding extent of the section, for example 20 cm, it may nevertheless be ensured that the distortions are corrected throughout the depth. A 3D MR image of this kind with an extended Field of View can be used for example for human attenuation correction in an MR/PET hybrid system. The human attenuation correction can then be carried out over the entire region of the 3D MR image.

It is also possible for all layers to acquire all associated MR data if the respective layer includes the section. If, namely, all MR data is acquired if the respective layer in the first direction is arranged for example inside the extent of the section in this direction, it is thus ensured that the distortions are compensated in the MR data acquired for the different layer.

Positioning in the first direction can in particular occur between two recording sequences belonging to different layers and be interrupted during the recording sequences. This means that during execution of a recording sequence no movement occurs for example of the table of an MR system and therewith of the object to be examined. This allows particularly stable system parameters during imaging and therewith a high signal-to-noise ratio.

On the other hand it is also possible for the positioning in the first direction to be carried out continually and continuously at a constant speed.

In this connection the constant speed can be chosen such that all MR data of a layer is recorded if the layer includes the section.

If positioning is carried out continuously and continually at a constant speed this means that the object to be examined continues to move during a time interval, for example during the time interval corresponding to a recording sequence. The higher the speed of positioning, the greater a specific length is by which the object to be examined continues to move during a certain time interval. A recording sequence for MR data is typically characterized by a certain required period. These periods can vary greatly as a function of the parameters of the measuring sequence. Certain measuring sequences require longer recording sequences for acquiring MR data of individual layers. Other measuring sequences are optimized to require particularly short periods for executing a recording sequence.

In this connection the speed of positioning of the object to be examined can be adjusted such that the specific length, i.e. the length by which the object to be examined moves during execution of a recording sequence, is smaller than the extent of the section in the first direction. The extent of the section in the first direction is typically determined by system-related parameters, such as the construction of the magnetic resonance system. These parameters are generally difficult to influence or can only be influenced at great cost.

On the other hand, the length of a recording sequence and the positioning speed of the object to be examined are typically influenced comparatively easily. It is then possible to coordinate the two in such a way that the specific length and the extent of the section in the first direction are roughly the same size or the specific length is smaller than the extent of the section in the first direction.

It is also possible for the recording sequences for at least two layers to overlap timewise. For example, a measuring sequence, which comprises a plurality of recording sequences for the acquisition of MR data for different layers, can be designed as what is known as an "interleaved" measuring sequence. Interleaved measuring sequences denote MR measuring sequences in which the recording sequences for different layers overlap timewise. For example, certain positions of the k-space can be alternately sampled for different recording sequences.

The transversal magnetization of more than one layer does not have to be simultaneously addressed or read out here, however. It is also possible in this regard, however, to use the transversal magnetization of a plurality of layers simultaneously within the framework of for example what is known as "multiplexing" measuring sequences. For example, the excitation of the layers can occur simultaneously by way of correspondingly formed pulses or the detection of a signal can occur simultaneously for a plurality of layers.

It may be ensured by way of timewise coordination of positioning with the recording sequences that if a layer includes the section, spatial encoding of the magnetic resonance data encodes identical predetermined locations by way of a second gradient field for all layers.

The second gradient field can for example cause phase encoding of the location perpendicular to the first direction between an excitation pulse and signal detection.

For example, synchronization of positioning and recording sequences can occur such that in an isocenter of the magnetic resonance system spatial frequency space data close to a spatial frequency space center of the k-space are obtained by way of the spatial encodings of the second gradient field. This means that in the center of the magnetic resonance system, the isocenter, where for example the signal-to-noise ratio assumes particularly high values, the MR data points close to the k-space center are obtained. However, it is also possible to carry out a different allocation between positioning and spatial encoding.

In particular, positioning according to at least one embodiment of the aspect currently being discussed can also include the allocation of the spatial encoding of the MR data by the second gradient field to positions in the first direction in such a way that different locations are encoded by the spatial encodings of the second gradient field at different positions in the first direction. This is synonymous with a repeated, for example continuous positioning of the object to be examined during simultaneous execution of different recording sequences. Whenever a layer occupies a certain location in the direction of positioning (first direction), certain points in the k-space clearly allocated to this position are sampled. This enables identical regions in the k-space to have an identical degree of compensation of the inhomogeneities of the basic magnetic field and therewith a comparable degree of distortion.

An isocenter of the magnetic resonance system can also be at the same height as the section in relation to the first direction. The isocenter typically denotes the geometric center of a superconducting magnet, which is wound for example in the manner of a coil around a tube of the MR system. Particularly high values of the homogeneity of the basic magnetic field or a particularly high signal-to-noise ratio is/are to be expected here. It can be desirable to arrange for example the center of the section at a position in the first direction which is the same as the position of the isocenter in the first direction since it may then be possible for a particularly large section to carry out compensation of the inhomogeneities of the basic magnetic field. This may be the case since the change in the inhomogeneities of the basic magnetic field can be particularly low in the first direction close to the isocenter.

The first gradient field can cause spatial encoding of the MR data by frequency encoding in the first direction or perpendicular to the first direction during an excitation pulse or during a signal detection. Frequency encoding (layer selection gradient) and readout encoding (readout gradient) are typically carried out for spatial encoding of MR data. The selection of certain volume elements occurs by way of a frequency encoding of the precession frequency of the nuclear spin.

The method according to at least one embodiment of the aspect currently being discussed can also include determining a relative gradient error of the first gradient field in the section, which results from the difference in the non-linearity from a linear case as a function of a gradient strength of the first gradient field. It can also include determining the local inhomogeneity of the basic magnetic field in the section and determining the gradient strength based on the relative gradient error and the local inhomogeneity. By determining or measuring the relative gradient error and the inhomogeneity of the basic magnetic field compensation can occur based thereon by way of suitable choice of the gradient strength. The gradient strength denotes the local rate of change in the gradient field here.

The first direction can also be perpendicular to a layer of the object to be examined. If for example the object to be examined is arranged in the coil axis of superconducting basic field magnet, its positioning can occur along the coil axis. A layer then corresponds to a transversal plane of the object to be examined.

An attenuation correction for positron emission tomography can also be determined from the section as a function of the MR data. Since the arms of a patient for example can be located in the section, a particularly accurate attenuation correction can consequently be carried out. This is the case since in this example the MR data, which is based on the arms, has no or only slight distortion owing to the compensation.

According to a further embodiment, a magnetic resonance system for acquiring MR data for a plurality of layers of an object to be examined in a section of the magnetic resonance system is provided with a basic magnetic field, wherein the section is located at the edge of a Field of View of the magnetic resonance system in the first direction. The magnetic resonance system comprises a gradient system which is configured to produce a first gradient field with a non-linearity of its location dependence in such a way that in the section the non-linearity compensates a local inhomogeneity of the basic magnetic field. The MR system also comprises a couch, which can be moved in a first direction, having an object to be examined arranged thereon, which is configured to position the object to be examined in the first direction several times, so the plurality of layers of the object to be examined perpendicular to the first direction successively comprises the section, and a receiving system which is configured to acquire magnetic resonance data for each of the layers with recording sequences.

Effects can be achieved with a magnetic resonance system having such properties which match the effects which have been described above in relation to at least one embodiment of the corresponding methods.

The above-described properties, features and advantages of this invention and the manner in which these are achieved will become clearer and more understandable in connection with the following description of the exemplary embodiments which will be illustrated in more detail in connection with the drawings, wherein FIG. 1 shows a schematic diagram of a magnetic resonance (MR) system 5 (of an MRT or nuclear spin tomography device). A basic field magnet 1 produces a strong basic magnetic field, which is constant over time, for polarization or orientation of the nuclear spins in a region of an object to be examined U, such as a part of a human body to be examined which is located on a table 23 and is pushed into the magnetic resonance system 5. The basic magnetic field is produced by superconducting coils. The coil axis is arranged in direction A. Inside the coil is constructed a tube in which table 23 can move. The table can move in the direction denoted by A (a direction perpendicular thereto and denoted by B in the horizontal plane). The largest component of the basic magnetic field also points in direction A in FIG. 1. The high homogeneity of the basic magnetic field required for the nuclear spin resonance measurement is defined in a typically spherical measuring volume M in which the parts of the human body to be examined are introduced. The measuring volume M can include the isocenter 50 of the MR system 5 for example. The isocenter can be located on the coil axis of the basic magnetic field. The measuring volume M can also be called the Field of View.

To promote the homogeneity requirements, and in particular to eliminate influences that are invariable over time, what are known as shim sheets made from ferromagnetic material are provided at a suitable location. Influences that are variable over time are eliminated by shim coils 2 and a suitable control 27 for the shim coils 2.

Inserted in the basic field magnet 1 is a cylindrical gradient coil system 3 which consists of three part-windings. Each part-winding is supplied with current from a corresponding amplifier 24-26 to produce a linear gradient field in the respective direction of a Cartesian coordinate system. The first part-winding of the gradient field system 3 produces a gradient Gx in the x direction, the second part-winding a gradient Gy in the y direction and the third part-winding a gradient Gz in the z direction. The amplifiers 24-26 each comprise a digital-to-analog converter (DAC) which is controlled by a sequence controller 18 for producing gradient pulses at the correct time.

Inside the gradient field system 3 is located a high frequency antenna 4 which converts the high frequency pulses emitted by a high frequency power amplifier into a magnetic alternating field to excite the nuclei and orient the nuclear spins of the object to be examined or the region to be examined of the object. The high frequency antenna 4 consists of one or more HF transmitter coils and a plurality of HF receiver coils in the form of a(n), by way of example, annular, linear or matrix-like arrangement of coils. The HF receiver coils of the high frequency antenna 4 also converts the alternating field emitted by the precessing nuclear spins, i.e. as a rule the nuclear spin echo signals caused by a pulse sequence from one or more high frequency pulse(s) and one or more gradient pulse(s), into a voltage (measurement signal) which is supplied via an amplifier 7 to a high frequency receiver channel 8, 8' of a high frequency system 22. The high frequency system 22 also comprises a transmitting channel 9, in which the high frequency pulses are produced for excitation of the nuclear magnetic resonance. The respective high frequency pulses are digitally presented as a sequence of complex numbers on the basis of a pulse sequence in the sequence controller 18 predefined by the system computer 20. This numerical sequence is supplied as real and imaginary parts via one input 12 respectively to a digital-to-analog converter (DAC) in the high frequency system 22 and from this to the transmitting channel 9. In the transmitting channel 9 the pulse sequences are modulated to a high frequency carrier signal whose base frequency corresponds to the resonance frequency of the nuclear spins in the measuring volume. The modulated pulse sequences of the HF transmitting coil are supplied to the high frequency antenna 4 via an amplifier 28.

The changeover from transmitting to receiving mode occurs by way of a duplexer 6. The HF transmitting coil of the high frequency antenna 4 radiates the high frequency pulses to excite the nuclear spins in the measuring volume M and scans resulting echo signals by way of the HF receiving coils. The nuclear resonance signals accordingly obtained are demodulated in a phase sensitive manner in a first demodulator 8' of the receiving channel of the high frequency system 22 to an intermediate frequency and are digitized in the analog-to-digital converter (ADC). This signal is demodulated again to the frequency zero. Demodulation to the frequency zero and the division into real and imaginary parts takes place following digitization in the digital domain in a second demodulator 8 which emits the demodulated data to an image processor 17 via outputs 11. The image processor 17 reconstructs an MR image from the measurement data obtained in this way. The management of the measurement data, image data and control programs takes place via the system computer 20.

On the basis of a default with control programs the sequence controller 18 controls production of the respectively desired pulse sequences and the corresponding sampling of the k-space within the framework of a recording sequence. In particular the sequence controller 18 controls the time-correct switching of the gradient, emission of the high frequency pulses with defined phase amplitude and receipt of the nuclear resonance signals. The sequence controller 18 can also control the movement of table 23 and therefore the positioning of the object to be examined U inside the measuring volume M. For example, the term "continuously moving table" or "syngo TimCT" denotes a method in which synchronization of MR data acquisition and positioning of the table 23 occurs.

The time basis for the high frequency system 22 and the sequence controller 18 is provided by a synthesizer 19. The choice of appropriate control programs for producing an MR image, which are stored for example on a DVD 21, and the display of the generated MR image occur via a terminal 13 which comprises a keyboard 15, a mouse 16 and a screen 14.

The measuring volume M, which is also called the Field of View (FoV), is limited on the hardware side by the basic magnetic field homogeneity and the linearity of the gradient field. Measurements outside of this measuring volume, i.e. in regions in which the basic magnetic field has inhomogeneities and the gradient field has non-linearities, lead to severe distortions, i.e. regions of the object to be examined which are arranged outside of the measuring volume M, do not appear in the magnetic resonance image at the point where they are situated in reality (for example in relation to the measuring volume), but at a position offset thereto. In a magnetic resonance tomograph with, by way of example, a tube diameter of 60 cm, the measuring volume M conventionally has a diameter of 50 cm by way of example, i.e. in an edge region along the inner circumference of the tomograph the distortion is more pronounced in a region of about 5-10 cm. The arms of a patient by way of example may be located in this region however. The position of the arms of the patient in the magnetic resonance image is incorrectly reproduced owing to the distortion. The magnetic resonance images in this region are therefore particularly unsuitable for a human attenuation correction in an MR/PET hybrid system.

Using the MR system shown in FIG. 1 it is possible to measure the inhomogeneities of the basic magnetic field in a section 51 which is located at the edge of the FoV. For example, the section can extend outwards from the FoV and touch the edge of the FoV. Based on the knowledge of the inhomogeneity of the basic magnetic field it is then possible to dimension a gradient field, for example a frequency encoding gradient field (which is applied during application of the HF pulses) or the read-out gradient field (which is applied during a signal detection period), in such a way that a non-linearity of the gradient field nullifies the inhomogeneity of the basic magnetic field. This will be illustrated by way of example below.

The above-mentioned distortions, which occur in the casing region or edge region 10 in particular, depend on the field difference dBg or dB0 from an ideal value or nominal value of the basic field magnet strength B0 and on the gradient field strength G. The following equations describe by way of example a two-dimensional magnetic resonance data acquisition with layer selection in the z direction, phase encoding in the y direction and frequency encoding in the x direction. The phase encoding direction, the frequency encoding direction and the layer selection direction are freely selectable and merely adapt the axis location to the equations.

$$z_1 = z + dB_{gz}(x,y,z)/G_z + dB_0(x,y,z)/G_z \quad (2)$$

$$x_1 = x + dB_{gx}(x,y,z)/G_x + dB_0(x,y,z)/G_x \quad (3)$$

$$y_1 = y + dB_{gy}(x,y,y)/G_y \quad (4)$$

The coordinates x,y,z denote the actual positions and the coordinates x1,y1,z1 the distorted positions.

Since the non-linearity dBg of the gradient field scales with the gradient field strength, the distortion can be purposefully reduced or compensated for a certain region or location, as is shown below. The following applies:

$$dB_{gx} = c(x,y,z) \cdot G_x \quad (5)$$

where c(x,y,z) denotes the relative gradient error at the location x,y,z and $G_x$ represents the gradient field strength.

The B0 field inhomogeneities are constant, however, independent of the gradient strength. The term dBgx/Gx is therefore constant and independent of the gradient field strength. The term dB0/Gx can change with the gradient field strength however. According to an embodiment of the present invention the magnetic fields are therefore overlaid in such a way that the non-linearity of the gradient field and the B0 field inhomogeneity are destructively overlaid at a predetermined location or a predetermined region. This will be described below by way of example for a read-out gradient in the x direction with a layer selection in the z direction. The required destructive overlaying of the magnetic fields succeeds if an optimum gradient strength Gx_opt exists for which the distortion at the predetermined location or within the predetermined region is zero. With a distortion of zero in the x direction the following applies:

$$x_1 = x$$

From this it follows:

$$G_{x\_opt} = -dB_0(x,y,z)/c(x,y,z) \quad (6)$$

If the gradient field strength Gx is chosen as described in equation (6), a much increased FoV results, i.e. the distortion decreases greatly in this region, for the predetermined position or the predetermined region.

Figure 2:
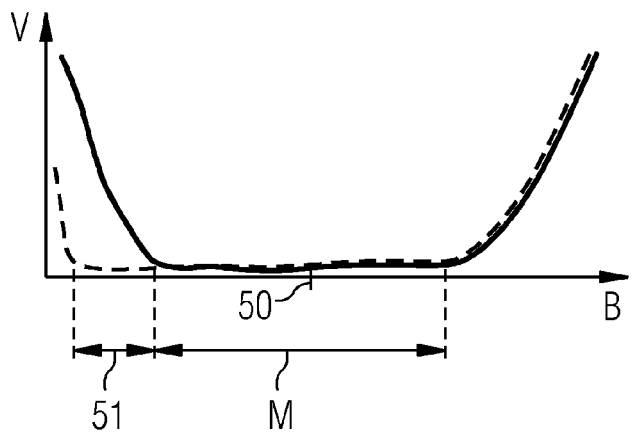
FIG. 2 shows the dependency of the distortion of MR data as a function of the position within an MR system.

A possible dependency of the distortion V on the position in direction B denoted in FIG. 1 is presented for example in FIG. 2. Direction B is perpendicular to direction A and is located in the horizontal plane. In FIG. 2 the distortion V without corresponding compensation is shown by way of a solid line. The isocenter 50 for example is arranged centrally within the measuring range M (shown in section). Within the measuring range M distortion V has comparatively low values, for instance <0.001 m. At points which are located in direction B outside of the measuring range M, distortion V increases for greater distances from the isocenter 50. Typical distortions can be 0.01 to 0.02 m for example. Section 51 then outwardly adjoins the measuring range M (shown on the left in FIG. 2).

Within section 51 it is possible, by appropriate selection of the gradient strength, i.e. a compensation of the inhomogeneities of the basic magnetic field, to correct distortion V. A corresponding dependency of distortion V on the position in direction B is shown in FIG. 2 by a broken line. The region in which distortion V can be minimized by suitable compensation (for example lower than a threshold value) determines the extent of the section 51. It should be clear that the exact position and extent of section 51 depends on various parameters, for example the type and strength of the inhomogeneity of the basic magnetic field, the non-linearity of the gradient fields etc. If, for instance, the inhomogeneity of the basic magnetic field is comparatively low, it may be possible to obtain a larger section 51 by way of appropriate compensation.

Whereas FIG. 2 shows only a correction of the distortions by way of compensation of the inhomogeneities of the basic magnetic field on one side of the axis B (shown on the left in FIG. 2), as already illustrated above, compensation of the distortion can also occur by way of an appropriate recording sequence adjoining both edges of the measuring range M (on the left and right of the measuring range M in FIG. 2). Such recording sequences typically comprise two 180° inversion pulses and the recording of two spin echoes.

FIG. 2 shows a section in direction B from FIG. 1. Distortion V shows strong dependency in direction B outside of the measuring range M, i.e. the Field of View. Distortion V typically also shows a dependency in direction A (not shown in FIG. 2). In FIG. 1 direction A describes the direction along the coil axis inside the tube and therewith the direction of the main magnetic field of the MR system as well and parallel to the direction of positioning of the table.

Figure 9:
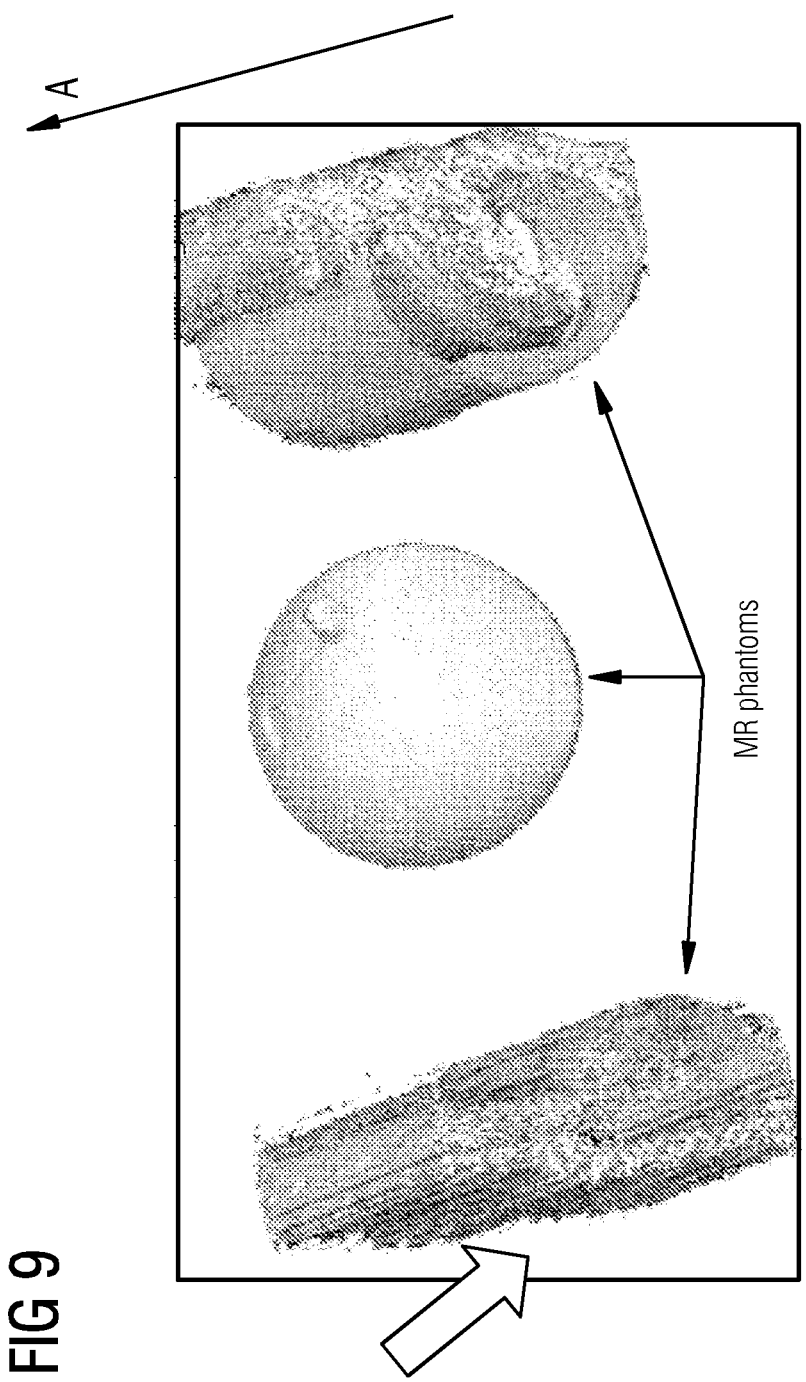
FIG. 9 shows a three-dimensional MR image based on measurement data without compensation of inhomogeneities and with severe distortions.

This dependency means that compensation of the inhomogeneities of the basic magnetic field, calculated for a specific position in direction A, is only valid for a specific length in direction A. In other words, the extent of the section is limited in direction A. Such a specific length can, depending on the specific construction of the magnetic resonance system, be 5 cm for example. It is then generally not easily possible to dimension the gradient field such that simultaneous compensation of inhomogeneities is possible along a plurality of points in direction A. Reference is made in this regard to FIG. 9 below in which a 3D MR image has been produced which covers a depth of 20 cm, i.e. is greater than the extent of the section in direction A and contains corresponding distortions.

In other words: section 51, for which an extension of the FoV may be achieved, is limited in its extent in direction A by the change in the inhomogeneity of the basic magnetic field itself.

To produce a 3D MR image it can however nevertheless be desirable to obtain MR images for various positions in direction A. These may be used later for example for the human attenuation correction in the MR/PET hybrid system. In the MR system according to FIG. 1 the sequence controller 18 is configured for this purpose such that, coordinated timewise with control of the various components of the actual recording sequence (HF pulses, magnetic field gradients, signal detection), the table 23 is also moved. It is then possible to position different positions of the object to be examined U inside the section 51 at the edge of the measuring volume M at various times. By way of suitable positioning, as is described in relation to the following figures, it is possible to record MR images for various positions of the object to be examined in direction A. However, since compensation of the basic field inhomogeneities is only carried out for a section with a finite extent in the direction of positioning, it is necessary to configure the synchronization of positioning and the recording sequences accordingly. This will be illustrated below.

Figure 3:
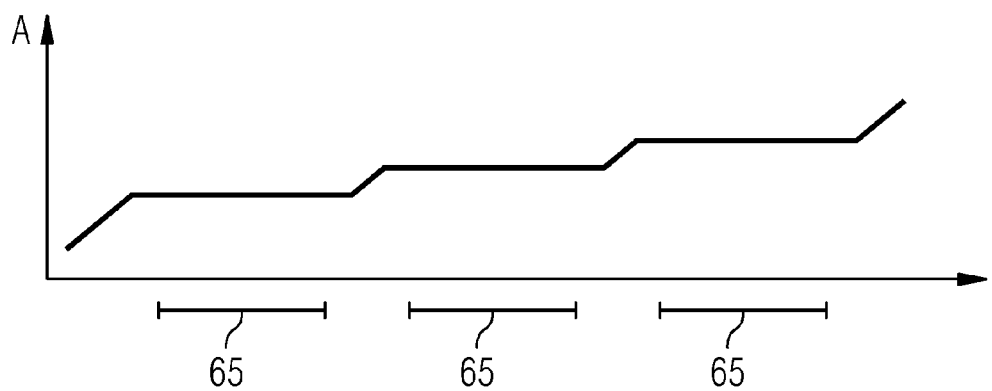
FIG. 3 illustrates the synchronization of the positioning of the object to be examined with the execution of recording sequences.

One possibility of synchronization of the recording sequence and positioning of table 23 consists for example in carrying out, alternately in each case, positioning and a recording sequence for recording all MR data belonging to one layer. A case of this kind is illustrated in FIG. 3 and shall be discussed in more detail below. FIG. 3 shows the position of the table 23 or of the object to be examined U as a function of time. The table 23 is moved or positioned in direction A, as is defined for example in FIG. 1. Positioning of the table is identified in FIG. 3 by a change in the position A over time. Three recording sequences 65 are carried out to record MR data from the layers which are located within the section for which compensation of the inhomogeneities of the basic magnetic field has been calculated respectively. Since the position A of the table 23 is varied between two recording sequences 65 respectively, MR data from different layers can be recorded in this way. A 3D MR image for example can be produced based on such MR data.

Due to the alternating positioning and execution of recording sequences 65, as is shown in FIG. 3, it is possible to record MR data for different layers in such a way that at the time of data acquisition the layer, for which MR data is being recorded respectively, is always located within the section. This means that with a corresponding compensation of the inhomogeneities of the basic magnetic field within the section by way of non-linearities of gradient fields it is possible for the Field of View, i.e. the measuring range M, to be expanded for each recorded layer.

Whereas an example embodiment has been illustrated in relation to FIG. 3 in which positioning of the table has been carried out alternately with execution of recording sequences, it is also possible to carry out a continuous change in the positioning of table 23 in direction A. This is described below in relation to FIG. 4.

Figure 4:
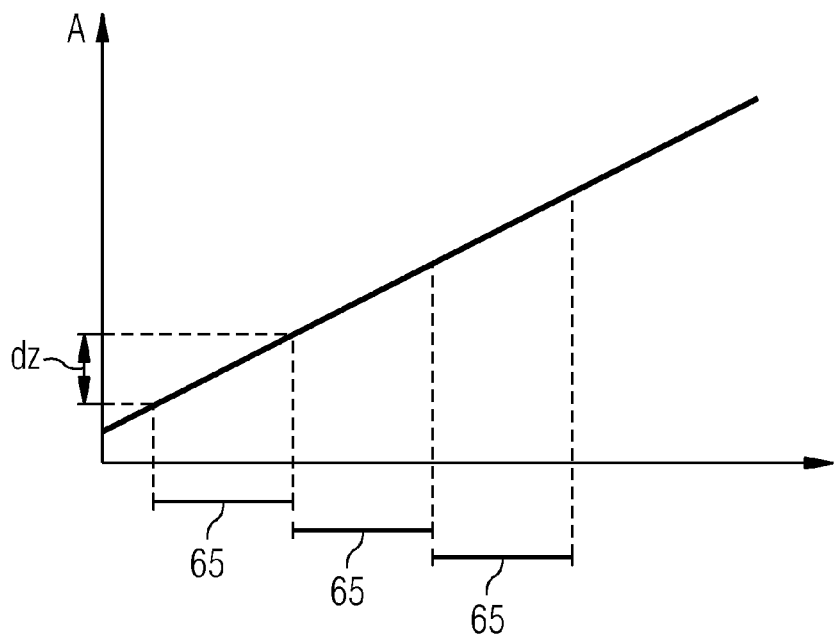
FIG. 4 illustrates the synchronization of the positioning of the object to be examined with the execution of recording sequences.

FIG. 4 shows a case in which position[ing] of the table in direction A is carried out continually and continuously at a constant speed. This is expressed in FIG. 4 by the fact that the gradient of the straight line describing the position in direction A is constant. Three recording sequences 65 are carried out to capture MR data from different layers. The three recording sequences 65 are carried out one after the other, so a recording sequence 65 begins once the preceding recording sequence 65 has ended. The recording sequences 65 are therefore carried out in series and not in parallel.

The recording sequences 65 and positioning of the table in direction A are synchronized in such a way that it is ensured that MR data is always acquired from a layer with a recording sequence 65 if the respective layer is located within the section for which the correction of the inhomogeneities of the basic magnetic field have been made. This means that with continuous movement of table A, a layer is moved for example through the section or its position changes in relation to the center of the section. The movement of the section (or of the object to be examined) for the duration of a recording sequence 65 is denoted by dz in FIG. 4. It is possible for example for the extent dz to be smaller than the extent of the section in direction z. It is then possible for all MR data of a layer to be acquired with a recording sequence at times at which the section is located within the respective layer or the layer includes the respective section.

It is possible to change the extent dz by way of an adjustment of the speed of positioning of the table. For example it is possible to reduce the positioning speed of the table, and this corresponds in FIG. 4 to a smaller gradient of the straight line. The extent dz, which describes the length in direction A by which the object to be examined is moved during the execution of a recording sequence 65 (of fixed duration), is also reduced as a result.

In particular it may also be possible to select the positioning speed of the table to be so high that the extent dz is slightly greater than the extent of the section in direction A. Not all MR data of a layer within the section would be acquired then. However, it may be sufficient if a significant portion of the MR data of a layer is acquired if the layer includes the section. For example, a significant portion can be 70% of all MR data of the respective layer or denote the data which is arranged close to the k-space center. This will be discussed in more detail below in relation to FIG. 6.

Figure 5:
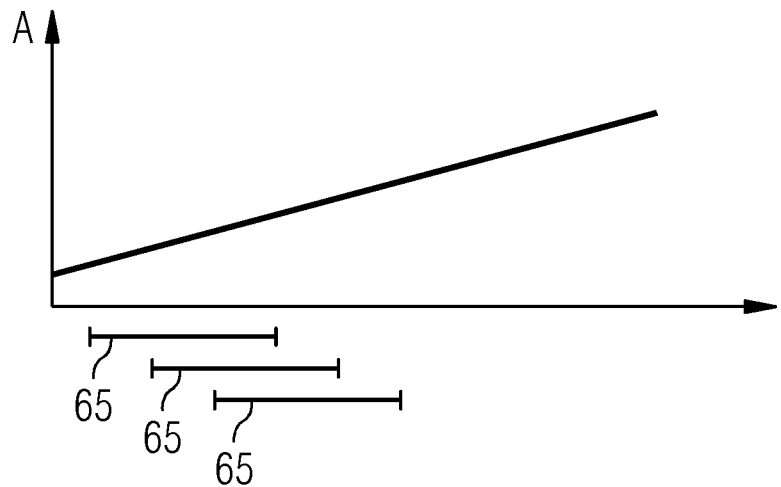
FIG. 5 illustrates the synchronization of the positioning of the object to be examined with the execution of recording sequences.

A further possibility relating to the continuous positioning of the table or object to be examined is shown firstly in FIG. 5. As may be seen from FIG. 5, in this example embodiment positioning of the table occurs continually and continuously at a constant speed. This can be seen on the basis of the constant gradient of the straight line describing the dependency of position A on time. This has already been illustrated in relation to FIG. 4. In contrast to the exemplary embodiment discussed in relation to FIG. 4, it is then possible in particular to carry out recording sequences 65, which each acquire MR data for different layers, in such a way that they at least partially overlap timewise. This is indicated by a graph in FIG. 5 in that the extents over time of the three illustrated recording sequences 65 overlap timewise.

Methods are known for example to the person skilled in the art which are known as "interleaved" measuring sequences. Interleaved measuring sequences denote MR measuring sequences in which the recording sequences for different layers overlap timewise. For example, certain positions of the k-space can be sampled alternately for different recording sequences. It is possible for example to firstly sample a first region of the k-space within the framework of a first recording sequence for a first layer, then to sample the corresponding first region of the k-space within the framework of a second recording sequence for a second layer, and then to sample a second region of the k-space within the framework of the first recording sequence for the first layer and then to sample this second region of the k-space for the second layer within the framework of the second recording sequence.

Whereas in an interleaved measuring sequence of this kind the transversal magnetization of two layers is not simultaneously used for imaging, it is, however, also possible to simultaneously use, within the framework of for example what are known as multiplexing measuring sequences, the transversal magnetization of a plurality of layers. For example, the excitation or detection of the precession of magnetization can occur simultaneously by appropriately formed pulses.

The person skilled in the art knows of methods for this purpose for example under the synonym "Generalized autocalibrating partially parallel acquisitions" (GRAPPA). A distinction in the MR data for different layers occurs for example in the case of GRAPPA by the use of a plurality of high frequency antennae, for example in coil form, wherein the various high frequency antennae have a different local sensitivity. The various acquired MR data then has signal components from various locations, it being possible to separate the information associated with various locations by applying suitable calculations.

Further appropriate methods are known to the person skilled in the art under the name "Sensitivity Encoding"

(SENSE), "Simultaneous Acquisition of Spatial Harmonics" (SMASH) and "Controlled Aliasing in Parallel Imaging Results in Higher Acceleration" (CAIPIRINHA). In some of these methods an additional acceleration of the MR imaging can occur in that not all points of the k-space are sampled. This means that during data acquisition the measuring resolution is purposefully reduced with respect to a maximum achievable measuring resolution. Subsampling of the k-space takes place. A reduced MR data set is obtained as a result. A reduction factor can identify subsampling. If the reduction factor is four for example, the measuring point density in the k-space is reduced by a factor of four. There are various possibilities for carrying out subsampling of the k-space with the given reduction factor. The manner in which subsampling occurs is called the subsampling pattern. For example, a subsampling pattern can determine which data points are acquired and in which sequence the data points are acquired, i.e. the trajectory of the data acquisition in the k-space. Before the data of the various coils is compiled the reduced MR data set can be reconstructed, so that a reconstructed MR data set is obtained. Reconstruction takes place by applying a reconstruction core to the reduced MR data of each coil.

FIG. 5 shows a partial timewise overlapping of the recording sequences 65. When carrying out a layer multiplexing measuring sequence as illustrated above, the recording sequences 65 of the different layers may also be carried out completely simultaneously therewith. This means that the start and end times are the same for all recording sequences 65.

In particular it is possible to also carry out such multiplexing measuring sequences within the framework of a recording of MR data in the section for which corrections of the inhomogeneities of the basic magnetic field have been made. The measurement duration of an individual recording sequence 65, which is based on the recording of MR data of an individual layer, can be reduced as a result. As illustrated in relation to FIG. 4, this can result in the possibility of the speed, at which the table, and therewith the object to be examined, is positioned or moved, being increased.

It can however be desirable for example for the rate of change in position A over time, i.e. the displacement speed of the table, to be selected to be so high that only some of the MR data for a specific layer is ever recorded at a time at which the corresponding layer is located within the section. For example, the data which corresponds to the k-space center can always be recorded if the corresponding layer is located within the section. The data of the k-space center is then in particular recorded in such a way that a compensation of the inhomogeneities of the basic magnetic field has taken place by way of the non-linearities of the gradient field. The MR data which is recorded within the section can be determined by the choice of a suitable subsampling pattern.

It should be clear that the timewise synchronization of the recording sequences 65 with the positioning in direction A may also be carried out in a different way. For example it is possible to record other regions of the k-space if the corresponding layer is located within the section or includes or touches the section. In particular specific sampling patterns of the k-space can be used to fill specific regions of the k-space with data if the layer is located in the section. Since different regions of the k-space have different effects on an MR image depicted in the image space, different effects can be achieved depending on the choice of sampling pattern or timewise synchronization of the table position with the recording sequences. In particular it may be possible to adjust these effects to the required MR data. In particular it may be necessary to sample certain regions of the k-space within the section for calculation of the human attenuation correction in MR/PET hybrid systems. This is described in detail in relation to FIG. 6.

Figure 6:
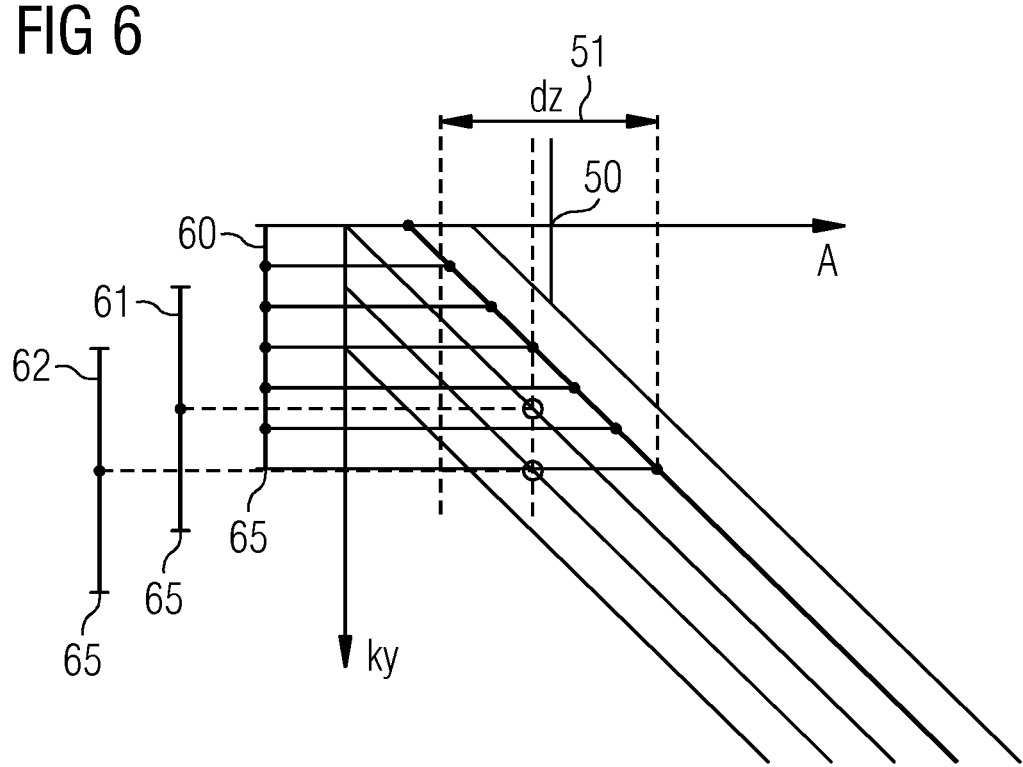
FIG. 6 illustrates the synchronization of the positioning of the object to be examined with the execution of recording sequences.

FIG. 6 shows an example embodiment in which different positions of the k-space firmly correspond to a specific allocation in direction A. Such a method is known for example from H.-P. Fautz and S. A. R. Kannengiesser in Magn. Reson. Med. 55 (2006) 363, the entire contents of which are hereby incorporated herein by reference. Sampling for specific phase encodings ky is shown vertically in FIG. 6.

Three recording sequences 65 are carried out which each record MR data from different layers 60, 61 and 62. The phase encoding ky is shown vertically in FIG. 6. As may be seen from FIG. 6, MR data, which corresponds to the same phase encoding ky, is always recorded at the same positions in direction A (shown horizontally in FIG. 6) for the different layers 60-62. In particular the data which is close to the k-space center (i.e. ky=0, and this is always the case in the center of a vertically illustrated recording sequence 65 in FIG. 6) is recorded within section 51 for which the correction of the inhomogeneities of the basic magnetic field has been made. Section 51 is shown in a graph in FIG. 6 and has an extent dz. This extent dz has already been discussed in relation to FIG. 4. As may also be seen from FIG. 6, the isocenter 50 of the magnetic resonance system is located within the extent dz of section 51.

Such a fixed allocation of specific phase encodings ky to specific positions A inside and outside of the section 51 means that identical k-space regions for different layers experience the same standard of compensation of the inhomogeneities of the basic magnetic field. This means that the distortions for different layers are roughly the same.

Figure 7:
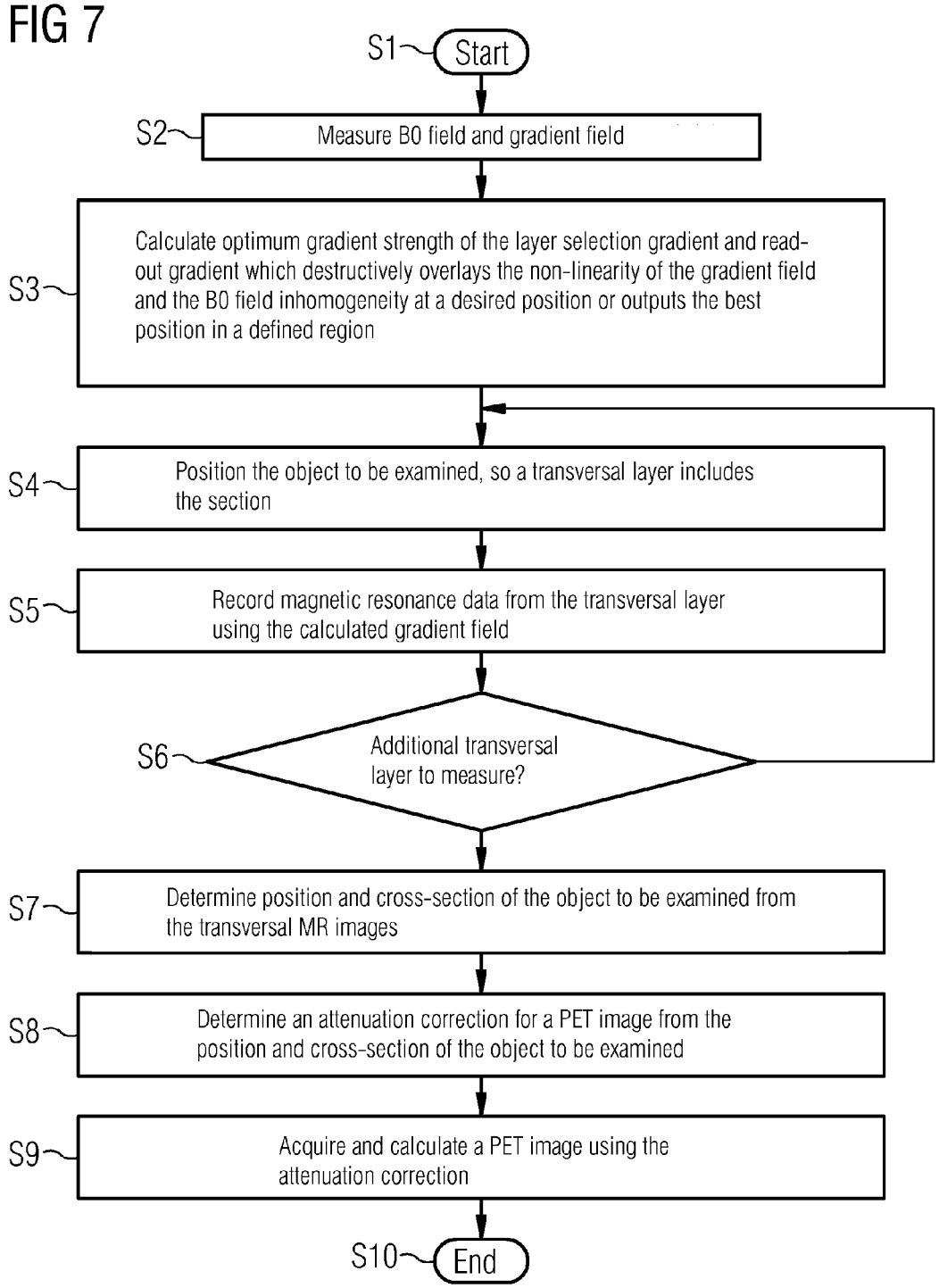
FIG. 7 is a flow diagram of a method for acquiring MR data of an object to be examined in a section at the edge of a Field of View.

FIG. 7 shows a flow diagram of a method for recording MR data from a section at the edge of the FoV of an MR system. The method begins with step S1. In step S2 the basic magnetic field and the gradient field of the magnetic resonance system are firstly determined to determine the basic magnetic field inhomogeneities and the relative gradient fields of the magnetic resonance system. An optimum gradient strength of the layer selection gradient and of the read-out gradient is then determined in step S3, whereby the non-linearity of the gradient field and the basic magnetic field inhomogeneity are destructively overlaid at a desired position.

The object to be examined U is then positioned in step S4 in such a way that a certain transversal layer, i.e. a layer with a layer normal line parallel to the positioning direction (direction A in FIG. 1), includes the section. Include can for example mean that the layer is arranged in the center of the section or also displaced in the positioning direction to one of the two sides of the section.

Using the calculated gradient fields MR data of this transversal layer is recorded in step S5. The MR data is recorded in the form of a recording sequence. Various recording sequences are possible, for instance the spin echo method or gradient echo method. The recording sequence of all layers as a whole is called a measuring sequence.

It is checked in step S6 whether MR data from a further transversal layer is to be measured, i.e. whether the measuring sequence has still not ended. If this is the case, steps S4 and S5 are carried out again in such a way that MR data from the further transversal layer can be recorded. This includes repositioning of the object to be examined in step S4.

By repeating steps S4 and S5 MR data is obtained for a plurality of transversal layers. Position and cross-sections of the object to be examined are determined from these transversal magnetic resonance images in step S7. This can mean for example that the MR data of the different layers is compiled to form a 3D MR image.

An attenuation correction for the PET image is determined in step S8 from the determined position and the determined cross-section of the object to be examined. Finally PET data is acquired in step S9 and by using the attenuation correction a PET image is calculated from this. The method ends with step S10.

Figure 8:
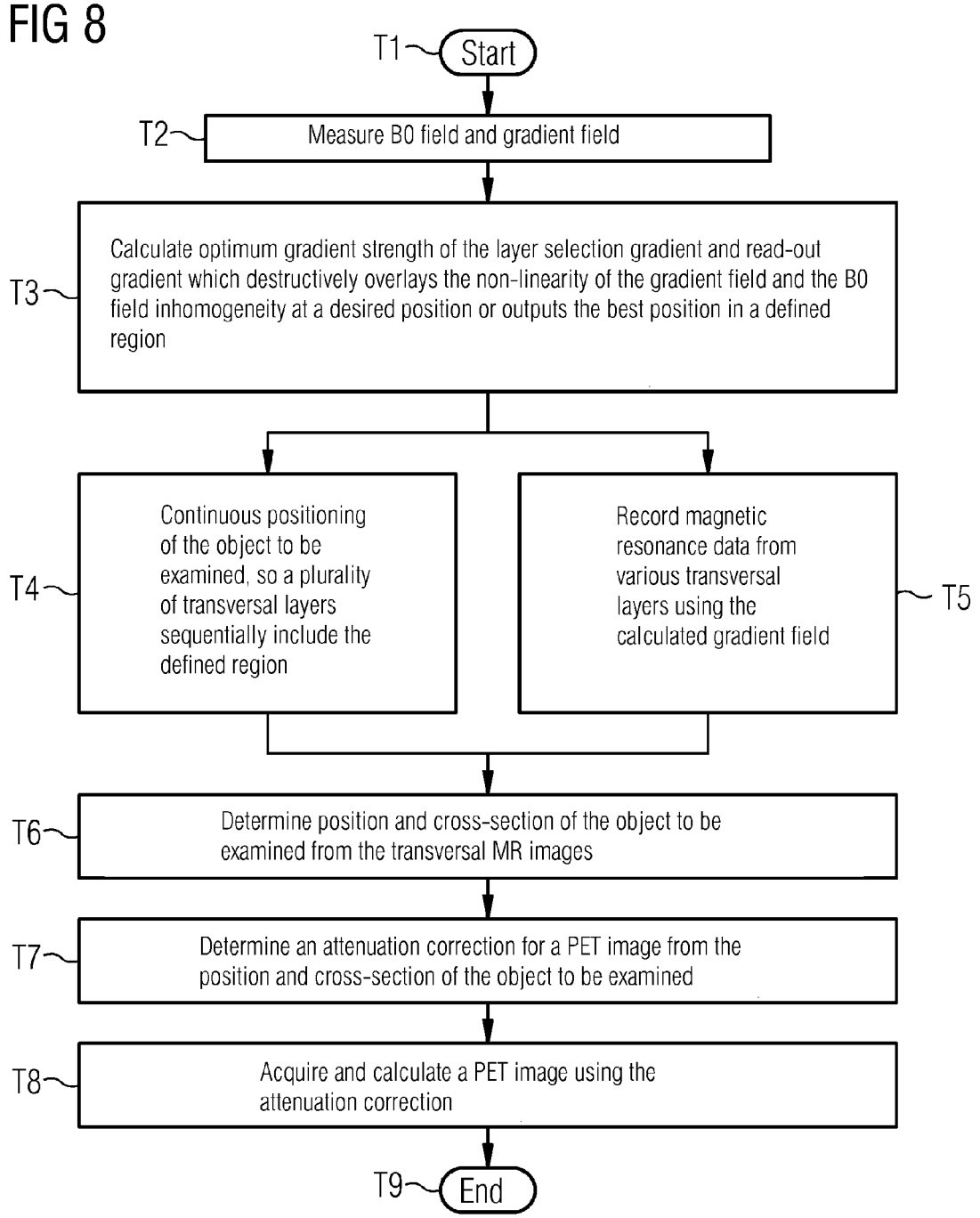
FIG. 8 is a flow diagram of a method for acquiring MR data of an object to be examined in a section at the edge of a Field of View.

FIG. 8 shows a flow diagram of a further embodiment of the present invention. MR data is again recorded for various transversal layers, wherein the MR data is at least partially recorded if the respective transversal layer is located within a section, i.e. includes the section. The gradient strength of the layer selection gradient and of the read-out gradient is calculated for this section in steps T2 and T3 in such a way that the non-linearity of the gradient field and the basic field inhomogeneity destructively overlap. Here steps T1-T3 correspond to steps S1-S3 from FIG. 7.

In contrast to FIG. 7, however, in the exemplary embodiment shown in FIG. 8 the positioning of the object to be examined, for example by positioning of the table on which the object to be examined is located, and recording of magnetic resonance data are carried out in parallel and simultaneously. Continuous positioning of the object to be examined occurs in step T4 for example. A result of this continuous positioning is that a plurality of transversal layers sequentially include the defined region. In other words, the transversal layers are successively moved through the defined region.

During the continuous positioning of the object to be examined in step T4, MR data is recorded from different transversal layers in step T5. The MR data from the different transversal layers can be recorded for example by means of interleaved measuring sequences or layer multiplexing measuring sequences. A reduced measurement duration for example can be achieved as a result. In particular, optimized sampling of the k-space may also occur in relation to the timewise synchronization with positioning of the object to be examined, which is simultaneously carried out in step T4. For example, the same k-space region can always be sampled for different transversal layers if the respective transversal layer is located within the section for which the gradient strength was optimized in step T3. However, it also possible for continuous positioning of the object to be examined to be carried out in step T4 in such a way that it is possible for all transversal layers to record all MR data, i.e. the entire k-space, while the respective transversal layer is located within the section.

In any case MR data from a plurality of transversal layers is recorded by carrying out steps T4 and T5. Then steps T6-T9 correspond to steps S7-S10 from FIG. 7.

Figure 10:
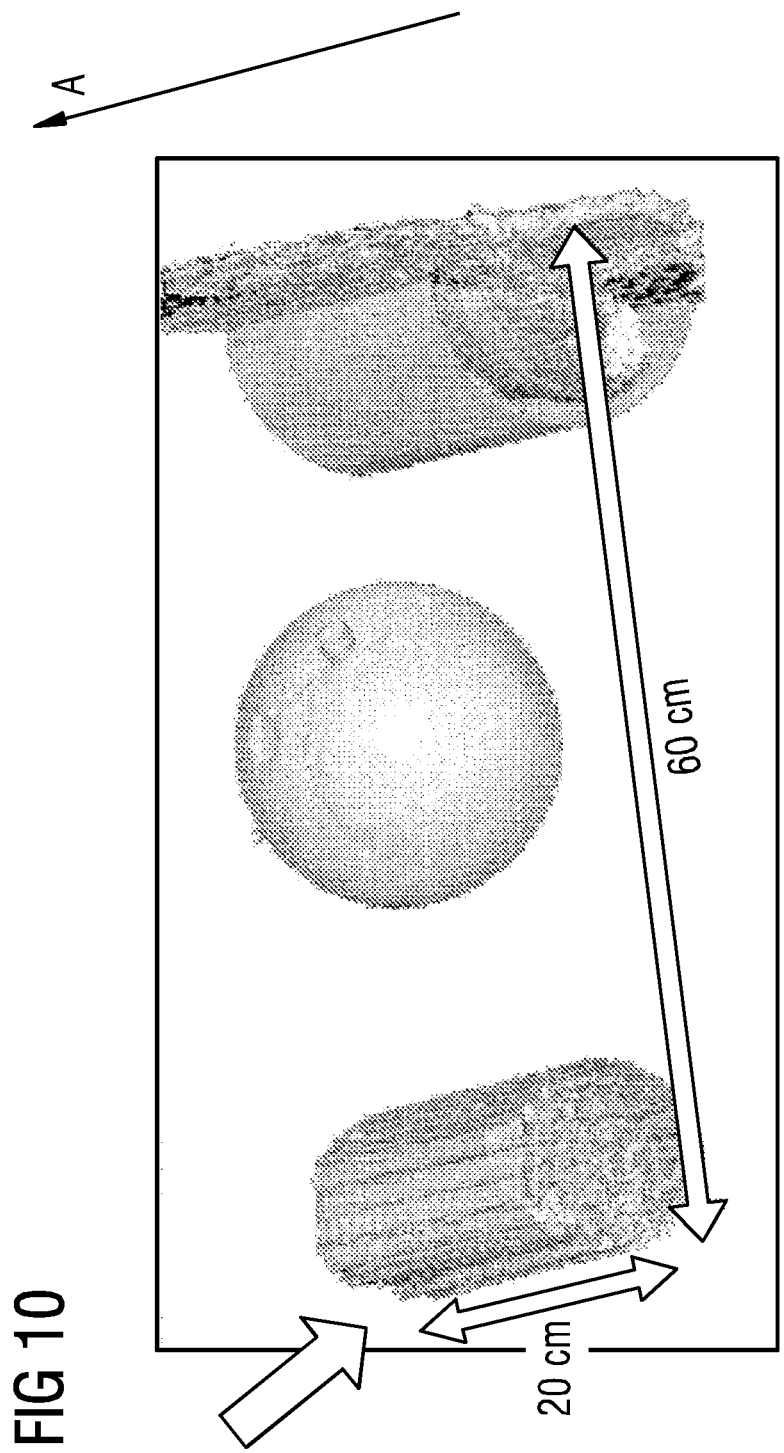
FIG. 10 shows a three-dimensional MR image based on measurement data with compensation of inhomogeneities without distortions.

FIGS. 9 and 10 show measurement data according to a preceding method. FIG. 9 shows MR measurement data of different layers in the form of a three-dimensional perspective image, i.e. a 3D MR image. MR data has been recorded for a plurality of layers in direction A, as is indicated in FIG. 9. The MR data has been compiled to form a three-dimensional image. The arrow in FIG. 9 marks the edge of the Field of View. As may be seen, distortions of the image reduce the resolution of the structural features of the MR phantom here. In contrast to this the Field of View has been widened in FIG. 10 by the region marked by the arrow. The distortions are removed and the MR phantom is resolved in its entirety.

FIG. 11 illustrates how three layers 60, 61, 62 may be arranged in relation to a section 51. The basic field magnet 1 of an MR system 5 is shown. The basic field magnet forms a tube. Tube axes and coil axis are arranged parallel to direction A. In the center of the tube is located the isocenter 50 of the MR system 5. Section 51 is arranged at the same height as the isocenters in relation to the coil axis A. However, the section is outwardly offset with respect to the coil axis at the edge of the Field of View of the MR system.

Layer 61 includes the section 51. In other words, the layer 61 is arranged at the same height as section 51 in relation to the coil axis A, so layer 61 intersects or touches section 51.

This is not the case for layers 60 and 62 which have different positions to section 51 in relation to coil axis A. However, layers 60 and 62 can be shifted by positioning in direction A, so they include section 51.

Although the invention has been illustrated and described in detail by the preferred exemplary embodiments, the invention is not limited by the disclosed examples and other variations can be derived herefrom by the person skilled in the art without departing from the scope of the invention.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for acquiring magnetic resonance (MR) data for a plurality of layers of an object to be examined in a section of a magnetic resonance system including a basic magnetic field, wherein the section is located at an edge of a Field of View of the magnetic resonance system in a first direction, the method comprising:
    producing a first gradient field with a non-linearity of its location dependence such that in the section the non-linearity compensates a local inhomogeneity of the basic magnetic field;
    positioning the object to be examined in the first direction in multiple ways such that the plurality of layers of the object to be examined, perpendicular to first direction successively, include the section; and
    acquiring magnetic resonance data for each of the layers with recording sequences.

2. The method of claim 1, wherein all associated MR data is acquired for all of the plurality of layers upon the respective layer including the section.

3. The method of claim 1, wherein positioning in the first direction occurs between two recording sequences belonging to different ones of the plurality of layers and is interrupted during the recording sequences.

4. The method of claim 1, wherein positioning in the first direction is carried out continually and continuously at a constant speed.

5. The method of claim 4, wherein the constant speed is chosen such that all MR data of a layer is recorded upon the layer including the section.

6. The method as claimed in claim 4, wherein the recording sequences for at least two layers overlap timewise.

7. The method of claim 1, wherein timewise coordination of positioning with the recording sequences ensures that upon a layer including the section, spatial encoding of the magnetic resonance data encodes identical locations by way of a second gradient field for all layers.

8. The method of claim 7, wherein the second gradient field causes phase encoding of the location perpendicular to the first direction between an excitation pulse and a signal detection.

9. The method of claim 7, further comprising:
    allocating the spatial encoding of the magnetic resonance data by way of the second gradient field to positions in the first direction, so different locations are encoded by the spatial encodings of the second gradient field at different positions in the first direction.

10. The method of claim 1, wherein an isocenter of the magnetic resonance system is at the same height as the section in relation to the first direction.

11. The method of claim 1, wherein the first gradient field causes spatial encoding of the MR data by way of a frequency encoding in the first direction, or perpendicular to the first direction, during an excitation pulse or during a signal detection.

12. The method of claim 1, further comprising:
    determining a relative gradient error of the first gradient field in the section, which results from a difference in a non-linearity from a linear case as a function of a gradient strength of the first gradient field;
    determining the local inhomogeneity of the basic magnetic field in the section; and
    determining the gradient strength based on the relative gradient error and the local inhomogeneity.

13. The method of claim 1, wherein the first direction is perpendicular to a layer of the object to be examined.

14. The method of claim 1, wherein an attenuation correction is determined for positron emission tomography as a function of the MR data from the section.

15. The method of claim 1, wherein the basic magnetic field is oriented in the first direction.

16. A magnetic resonance system for acquiring MR data for a plurality of layers of an object to be examined in a section of the magnetic resonance system including a basic magnetic field, wherein the section is located at an edge of a Field of View of the magnetic resonance system in a first direction, the magnetic resonance system comprising:
    a gradient system, configured to produce a first gradient field with a non-linearity of its location dependence in such a way that in the section, the non-linearity compensates a local inhomogeneity of the basic magnetic field;
    a couch, movable in the first direction with an object to be examined arranged thereon, configured to position the object to be examined several times in the first direction, so the plurality of layers of the object to be examined perpendicular to the first direction successively includes the section; and
    a receiving system, configured to acquire magnetic resonance data for each of the layers with recording sequences.

17. A non-transitory computer readable medium including program segments for, when executed on a computer device, causing the computer device to implement the method of claim 1.

18. The method of claim 2, wherein positioning in the first direction occurs between two recording sequences belonging to different ones of the plurality of layers and is interrupted during the recording sequences.

19. The method of claim 2, wherein positioning in the first direction is carried out continually and continuously at a constant speed.

20. The method as claimed in claim 5, wherein the recording sequences for at least two layers overlap timewise.

21. The method of claim 8, further comprising:
allocating the spatial encoding of the magnetic resonance data by way of the second gradient field to positions in the first direction, so different locations are encoded by the spatial encodings of the second gradient field at different positions in the first direction.

* * * * *